(12) United States Patent
Kishimura et al.

(10) Patent No.: US 7,169,530 B2
(45) Date of Patent: Jan. 30, 2007

(54) POLYMER COMPOUND, RESIST MATERIAL AND PATTERN FORMATION METHOD

(75) Inventors: Shinji Kishimura, Hyogo (JP); Masayuki Endo, Osaka (JP); Masaru Sasago, Osaka (JP); Mitsuru Ueda, Tokyo (JP); Hirokazu Imori, Aichi (JP); Toshiaki Fukuhara, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/954,374

(22) Filed: Oct. 1, 2004

(65) Prior Publication Data

US 2005/0186501 A1    Aug. 25, 2005

(30) Foreign Application Priority Data

Oct. 2, 2003    (JP) .............................. 2003-344701

(51) Int. Cl.
| | | |
|---|---|---|
| *G03C 1/73* | (2006.01) | |
| *G03F 7/039* | (2006.01) | |
| *G03F 7/20* | (2006.01) | |
| *G03F 7/30* | (2006.01) | |
| *C08F 226/02* | (2006.01) | |

(52) U.S. Cl. .................. 430/270.1; 430/325; 430/326; 430/311; 430/905; 430/907; 430/914; 430/945; 430/966; 526/288

(58) Field of Classification Search ..................... None
See application file for complete search history.

(56) References Cited

U.S. PATENT DOCUMENTS

| 4,491,628 A | 1/1985 | Ito et al. |
|---|---|---|
| 5,310,619 A | 5/1994 | Crivello et al. |
| 5,362,607 A | 11/1994 | Crivello et al. |
| 6,841,333 B2* | 1/2005 | Lamanna et al. ......... 430/270.1 |
| 2005/0147915 A1* | 7/2005 | Dammel .................. 430/270.1 |

FOREIGN PATENT DOCUMENTS

| JP | 57-153433 | 9/1982 |
|---|---|---|
| JP | 63-27829 | 2/1988 |
| JP | 2-27660 | 6/1990 |
| JP | 9-73173 | 3/1997 |
| JP | 9-227330 | 9/1997 |
| JP | 9-230595 | 9/1997 |
| JP | 10-10739 | 1/1998 |
| JP | 2000-33028 | 2/2000 |
| JP | 2000-330289 A | 11/2000 |
| JP | 2002-250215 | 9/2002 |
| JP | 2003-270789 | 9/2003 |
| JP | 2004-83873 | 3/2004 |
| WO | WO 97/33198 | 9/1997 |
| WO | WO 98/14831 | 4/1998 |
| WO | WO 99/49504 | 9/1999 |

OTHER PUBLICATIONS

Fujigaya, T. et al., "A New Photoresist Material for 157 nm Lithography-2", Journal of Photopolymer Science and Technology, vol. 15, No. 4, pp. 643-654, 2002.
Fujigaya, Tsuyohiko et al., "New Photoresist Materials for 157-nm Lithography", Chemistry of Materials, vol. 15, No. 7, pp. 1512-1517, 2003.
Iimori, H. et al., "A New Photoresist Materials for 157nm Lithograhpy-3", Journal of Photopolymer Science and Technology, vol. 16, No. 4, pp. 601-605, 2003.
Japanese Office Action issued in corresponding Japanese Patent Application No. 2004-278183, Dated Aug. 22, 2006.

* cited by examiner

*Primary Examiner*—Sin Lee
(74) *Attorney, Agent, or Firm*—McDermott Will & Emery LLP

(57) ABSTRACT

The base polymer of a resist material contains a polymer compound including a first unit represented by a general formula of the following Chemical Formula 4 and a second unit represented by a general formula of the following Chemical Formula 5:

Chemical Formula 4:

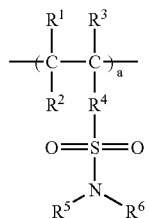

Chemical Formula 5:

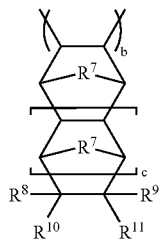

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or $-SO_2-$; $R^8$, $R^9$, $R^{10}$ and $R^{11}$ are the same or different and are a hydrogen atom, a fluorine atom, a hydroxyl group, $-OR^{13}$, $CO_2R^{13}$, $-R^2-OR^{13}$ or $-R^{12}-CO_2R^{13}$, at least one of $R^8$, $R^9$, $R^{10}$ and $R^{11}$ including $-OR^{13}$, $-CO_2R^{13}$, $-R^{12}-OR^{13}$ or $-R^{12}-CO_2R^{13}$ (wherein R 2 is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1.

25 Claims, 3 Drawing Sheets

POLYMER COMPOUND, RESIST MATERIAL AND PATTERN FORMATION METHOD

CROSS-REFERENCE TO RELATED APPLICATIONS

This application claims priority under 35 U.S.C. §119 on Patent Application No. 2003-344701 filed in Japan on Oct. 2, 2003, the entire contents of which are hereby incorporated by reference.

BACKGROUND OF THE INVENTION

The present invention relates to a resist material or a chemically amplified resist material suitably used in refinement technique, a polymer compound useful as a base polymer of the resist material, and a pattern formation method using the resist material.

In accordance with recent increase of the degree of integration and the operation speed of an LSI, there are increasing demands for refinement of an interconnect pattern rule.

The refinement of the interconnect pattern rule has been rapidly developed because of increased NA of a projection lens, improved performance of a resist material, a reduced wavelength of exposing light and the like.

With respect to increase of resolution and sensitivity of a resist material, a positive chemically amplified resist material using, as a catalyst, an acid generated through irradiation with exposing light exhibits high performance and hence has become a leading resist material particularly in the field of deep UV lithography (see Japanese Patent Publication No. 2-27660 and Japanese Laid-Open Patent Publication No. 63-27829).

Also, reduction of the wavelength of the exposing light from i line (of a wavelength of a 365 nm band) to KrF excimer laser (of a wavelength of 248 nm band) has brought a large technical innovation, and a resist material for the KrF excimer laser was applied to 0.30 μm process at first and to a 0.18 μm rule in the course of time and is now applied to mass-production employing a 0.15 μm rule.

Furthermore, a 0.13 μm rule has already been studied. Thus, the speed for development in the refinement has been increasing, and hence, it is necessary to further improve transparency and substrate adhesiveness of a resist material.

It is expected that the design rule can be further refined to 90 nm or less by using ArF excimer laser (of a wavelength of a 193 nm band) as the exposing light. However, a conventionally used resin such as a Noborac resin and a poly(vinylphenol)-based resin has strong absorption in the vicinity of the wavelength of the 193 nm band, and hence cannot be used as a base polymer of a resist material to be employed in this case.

Therefore, for attaining transparency and dry etching resistance, use of an acrylic resin or a cycloolefin-based alicyclic resin as a base polymer has been examined (see Japanese Laid-Open Patent Publication Nos. 9-73173, 10-10739 and 9-230595 and WO97/33198).

The other references related to the background of the invention are Japanese Laid-Open Patent Publication Nos. 2000-33028 and 2002-250215; Tsuyohiko FUJIGAYA, Shinji ANDO, Yuji SHIBASAKI, Mitsuru UEDA, Shinji KISHIMURA, Masayuki ENDO and Masaru SASAGO, "New Photoresist Material for 157 nm Lithography-2", J. Photopolym. Sci. Technol., 15(4), 643–654(2002); T. Fujigaya, Y Shibasaki, S. Ando, S. Kishimua, M. Endo, M. Sasago and M. Ueda, Chem. Mater. 2003, 15, 1512; and H. Iimori, S. Ando, Y Shibasaki, M. Ueda, S. Kishimura, M. Endo and M. Sasago, J. Photopolym. Sci. Technol. 2003, 16, 601.

An acrylic resin has, however, a problem that a resultant resist pattern is in a poor shape when it is used as a base polymer because it swells in development, and an alicyclic resin has a problem that solubility in a developer and substrate adhesiveness are degraded when it is used as a base polymer because it has a strong hydrophobic property.

On the other hand, $F_2$ laser (of a wavelength of a 157 nm band) is expected to attain refinement of the design rule to approximately 65 nm or less, but it is difficult to attain sufficient transparency of a base polymer. It has been found that an acrylic resin that is used as a base polymer in using ArF excimer laser does not transmit light at all, and that a cycloolefin-based resin having a carbonyl bond has strong absorption against the $F_2$ laser. Furthermore, poly(vinylphenol), which is used as a base polymer in using KrF excimer laser, has an absorption window (namely, a region that has high transparency because exposing light is not absorbed therein) in the vicinity of a wavelength of a 160 mn band, and hence the transmittance is slightly improved when it is used, but it has been found that the transmittance is still far from practical level (that is, transmittance of 40% or more).

SUMMARY OF THE INVENTION

In consideration of the aforementioned conventional problems, an object of the invention is providing a resist material and more specifically a chemically amplified resist material that has high transmittance against exposing light of a wavelength not longer than a 300 nm band, and in particular, deep UV such as KrF laser (of a wavelength of a 248 nm band) or ArF laser (of a wavelength of a 193 nm band) or vacuum UV such as $F_2$ laser (of a wavelength of a 157 mn band), $Kr_2$ laser (of a wavelength of a 146 nm band), KrAr laser (of a wavelength of a 134 nm band) or $Ar_2$ laser (of a wavelength of a 126 nm band), is good at substrate adhesiveness, does not swell in development and exhibits high solubility in a developer; a novel polymer compound useful as a base polymer of the resist material; and a pattern formation method using the resist material.

As described above, since a carbonyl group or a double bond of carbon has absorption in the vicinity of the 157 nm band, it seems to be one effective method for improving the transmittance to reduce such a unit.

Furthermore, it has been found through recent study that transparency is remarkably improved in the vicinity of the 157 nm band by introducing a fluorine atom into a base polymer. Actually, a polymer in which fluorine is introduced into an aromatic ring of poly(vinylphenol) attains transmittance at almost practical level.

It has been found, however, that such a base polymer is difficult to practically use in a resist material because a negative reaction is largely proceeded through irradiation with high energy beams such as $F_2$ laser.

Also, it has been found that an acrylic polymer or a polymer in which fluorine is introduced into a polymer compound having, on a main chain, an aliphatic cyclic compound obtained from a norbornene derivative has high transparency and is free from the negative reaction. However, it has been also found that the substrate adhesiveness of a resist film and permeability of a developer tend to be degraded when the introducing rate of fluorine is increased for further improving the transparency.

Furthermore, the present inventors have earnestly made examination, resulting in finding that a resist film including, as a base polymer, a polymer compound having a vinyl sulfonic acid ester unit has high substrate adhesiveness and developer solubility and improved transparency for a developer but is swelled in development and is difficult to control in the dissolving rate.

The present inventors have earnestly made examination for achieving the object, and as a result, have found that a resist material and more particularly a chemically amplified resist material that is,good at transparency, has high substrate adhesiveness, does not swell in development and exhibits high solubility in a developer can be obtained when a polymer including a sulfonamide compound having a sulfonamide group on the side chain is used as a base polymer.

Specifically, a sulfonamide compound having a sulfonamide group on the side chain has high transmittance against exposing light of a wavelength not longer than a 300 nm band although it includes two sulfur-oxygen double bonds. In addition, a resist film containing, as a base polymer, a polymer compound including a unit of a sulfonamide compound having a sulfonamide group on the side chain is remarkably improved in the substrate adhesiveness and the developer permeability as compared with a resist film containing a base polymer of a simple fluorine-containing polymer.

First, the mechanism of improving transparency and an effect attained by the improvement of the transparency will be described.

It has been found that although a base polymer including a unit having a sulfonamide group on the side chain has two sulfur-oxygen double bonds, it has high transmittance against exposing light of a wavelength not longer than a 300 nm band. The unit having a sulfonamide group on the side chain can constitute a base polymer without using any carbonyl group on all the side chains included in the base polymer. Therefore, since the base polymer can be obtained while suppressing the proportion of carbonyl groups having a high absorption property against exposing light of a wavelength of a 200 nm band in particular, the transparency of the resist film against light of a shorter wavelength band can be improved.

Accordingly, since the exposing light reaches the bottom of the resist film in pattern exposure, the resist film is changed to a developable state even in a bottom portion thereof, or a sufficient amount of acid is generated in an exposed portion and hence the resist film is changed to a developable state even in the bottom portion thereof. As a result, a good resist pattern can be formed.

It is noted that when a plurality of $CF_3$ groups are introduced into the base polymer, the transparency of the resist film against the exposing light is improved. This is for the following reason: When a plurality of F atoms are present in the base polymer, the absorption peak of the exposing light against a resist film having a structure in which substituent groups in any positions are not replaced with F atoms is shifted, resulting in moving the initial absorption band of the exposing light.

Furthermore, a resist film including a fluorine-containing polymer as a base polymer is generally of a type having carbonyl ester on the side chain. On the other hand, the base polymer according to the present invention has a sulfonamide group on the side chain. In a sulfonamide group, an oxygen atom with a strong negative property and large polarity and a sulfur atom are bonded through a double bond, and free electrons on the oxygen atom not related to the bond are present in a delocalized state. Therefore, when a sulfonamide group is introduced into the side chain of the base polymer, a portion of the base polymer corresponding to the sulfonamide group exhibits strong polarity, and hence, electronic interaction is easily caused between the sulfonamide group and a substrate or ion interaction is caused between the sulfonamide group and an alkaline group included in a developer. As a result, the substrate adhesiveness of the resist film is improved and reactivity of an exposed portion against the developer is improved.

Moreover, it has been found that swelling of the resist film can be suppressed when the base polymer has a sulfonamide group on the side chain.

A conventional acrylic resist material includes, on the side chain, a unit that is changed into a carboxylic acid group through exposure as a unit for causing a reaction with the developer. In a carboxylic acid group, a H atom and an O atom interacts with each other through a hydrogen bond as shown in Chemical Formula 16 below, and hence, the carboxylic acid group tends to form a hexagonal structure in which two molecules oppose each other. Since electrons form an octet in this hexagonal structure, the structure is sterically stable. When bonds having such a structure are generated in various portions of the base polymer after the exposure, three-dimensional bonds tend to be formed between the side chains of the polymer, and hence the polymer is easily formed in a mesh structure. As a result, the resist film swells.

Chemical Formula 16:

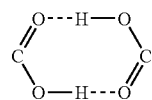

On the other hand, the resist material of the present invention includes a unit having a sulfonamide group on the side chain as the unit for causing a reaction with the developer after the exposure. In a sulfonamide group, bonds mutually easily coupled cannot be formed owing to its structure differently from a carboxylic acid group. Therefore, even when the unit that can react with a developer is formed after the exposure, the terminal groups of the base polymer minimally form three-dimensional bonds, and a mesh structure is minimally formed. As a result, swelling of the resist film can be suppressed.

The present invention was devised on the basis of the aforementioned findings, and is specifically practiced as follows:

The polymer compound of this invention includes a first unit represented by a general formula of the following Chemical Formula 17 and a second unit represented by a general formula of the following Chemical Formula 18 and has a weight-average molecular weight not less than 1,000 and not more than 500,000:

Chemical Formula 17:

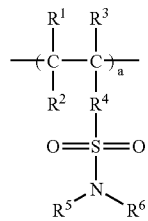

-continued

Chemical Formula 18:

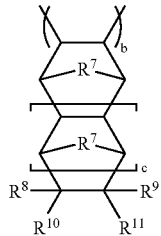

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or —$SO_2$—; $R^8$, $R^9$, $R^{10}$ and $R^{11}$ are the same or different and are a hydrogen atom, a fluorine atom, a hydroxyl group, —$OR^{13}$, —$CO_2R^{13}$, —$R^{12}$—$OR^{13}$ or —$R^{12}$—$CO_2R^{13}$, at least one of $R^8$, $R^9$, $R^{10}$ and $R^{11}$ including —$OR^{13}$, —$CO_2R^{13}$, —$R^{12}$—$OR^{13}$ or —$R^{12}$—$CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1.

The polymer compound of this invention has a sulfonamide group (a $SO_2N$ group) on the side chain of the first unit, and hence, a sulfur atom (S) included in the sulfonamide group has positive polarity while an oxygen atom (O) included in the sulfonamide group has negative polarity. Therefore, the first unit having the sulfonamide group has a high hydrophilic property. Also, since the polymer compound of this invention has the sulfonamide group on the side chain of the first unit, the transparency thereof is also improved. Furthermore, since the second unit has a benzene ring on the side chain, the dry etching resistance can be improved.

The polymer compound of this invention preferably further includes a third unit represented by a general formula of the following Chemical Formula 19:

Chemical Formula 19:

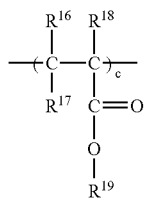

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$.

Thus, since $R^{19}$ of the third unit is a hydrogen atom or the like as described above, the solubility is high and hence the dissolution contrast can be improved. Furthermore, since the third unit has an ester bond with a high hydrophilic property, the substrate adhesiveness can be improved. Moreover, when $R^{19}$ is selected so as to attain a desired function, the dissolution contrast and the substrate adhesiveness can be further improved and the dry etching resistance can be improved.

In the polymer compound of this invention, the protecting group released by an acid is preferably an acetal group.

Thus, since an acetal group includes an ether bond and has an unpaired electron pair on an oxygen atom, it has high reactivity against an acid. In other words, it needs smaller activation energy for reacting with an acid. Therefore, the protecting group of the acetal group can be easily released by an acid. Also, the sulfonamide compound having the acetal protecting group is obtained by, for example, allowing a sulfonamide compound to react with a vinyl ether compound or methyl ether halide.

The resist material of this invention includes a base polymer containing a polymer compound including a first unit represented by a general formula of the following Chemical Formula 20 and a second unit represented by a general formula of the following Chemical Formula 21:

Chemical Formula 20:

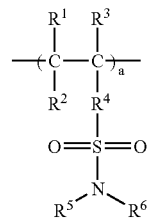

Chemical Formula 21:

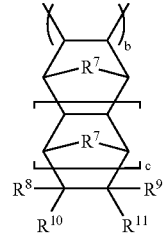

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or —$SO_2$—; $R^8$, $R^9$, $R^{10}$ and $R^{11}$ are the same or different and are a hydrogen atom, a fluorine atom, a hydroxyl group, —$OR^{13}$, —$CO_2R^{13}$, —$R^{12}$—$OR^{13}$ or —$R^{12}$—$CO_2R^{13}$, at least one of $R^8$, $R^9$, $R^{10}$ and $R^{11}$ including —$OR^{13}$, —$CO_2R^{13}$, —$R^{12}$—$OR^{13}$ or —$R^{12}$—$CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1.

The resist material of this invention includes the base polymer having a sulfonamide group on the side chain of the first unit, and hence, a sulfur atom included in the sulfonamide group has positive polarity while an oxygen atom included in the sulfonamide group has negative polarity. Therefore, the first unit having the sulfonamide group has a high hydrophilic property. Accordingly, the substrate adhesiveness of a resultant resist film is improved and the resist film is free from swelling and is good at developer solubility, and hence, a resultant resist pattern can be formed in a good shape. Also, since the base polymer has the sulfonamide group on the side chain of the first unit, although it includes two sulfur-oxygen double bonds, it has high transmittance against exposing light of a wavelength not longer than a 300 nm band. Furthermore, since the second unit of the base polymer has a benzene ring on the side chain, the dry etching resistance can be improved.

The resist material of the invention preferably further includes an acid generator for generating an acid through irradiation with light.

Thus, a positive chemically amplified resist material having the aforementioned effects can be realized.

In the resist material of the invention, $R^3$ of the first unit is preferably a trifluoromethyl group.

Thus, the transparency can be further improved.

In the resist material of the invention, the second unit is preferably represented by the following Chemical Formula 22:

Chemical Formula 22:

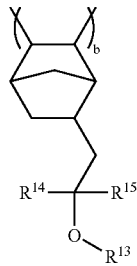

wherein $R^{13}$ is a hydrogen atom, a straight-chain alkyl group, a branched or cyclic alkyl group or a fluoridated alkyl group with a carbon number not less than 1 and not more than 20, or a protecting group released by an acid; $R^{14}$ and $R^{15}$ are trifluoromethyl groups; and b is 1.

Since the second unit includes a trifluoromethyl group in this manner, the transparency can be further improved.

The resist material of the invention preferably further includes a third unit represented by a general formula of the following Chemical Formula 23:

Chemical Formula 23:

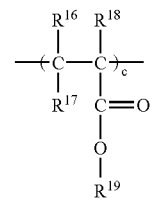

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$.

In the resist material of the invention, $R^{18}$ of the third unit is preferably a trifluoromethyl group.

Thus, the transparency can be further improved.

In the resist material of the invention, the protecting group released by an acid is preferably an acetal group.

Thus, since an acetal group includes an ether bond and has an unpaired electron pair on an oxygen atom, it has high reactivity against an acid. In other words, it needs smaller activation energy for reacting with an acid. Therefore, the protecting group of the acetal group can be easily released by an acid.

In the resist material of the invention, the acetal group is preferably an alkoxyethyl group or an alkoxymethyl group.

Examples of the alkoxyethyl group are an adamantyloxyethyl group, a t-butyloxyethyl group, an ethoxyethyl group and a methoxyethyl group.

Examples of the alkoxymethyl group are an adamantyloxymethyl group, a t-butyloxymethyl group, an ethoxymethyl group and a methoxymethyl group.

The first pattern formation method of this invention includes the steps of forming a resist film containing a base polymer including a polymer compound having a first unit represented by a general formula of the following Chemical Formula 24 and a second unit represented by a general formula of the following Chemical Formula 25; irradiating selectively the resist film with exposing light of a wavelength not shorter than a 100 nm band and not longer than a 300 nm band or not shorter than a 1 nm band and not longer than a 30 nm band or electron beams; and developing the resist film after the pattern exposure:

Chemical Formula 24:

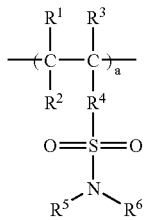

Chemical Formula 25:

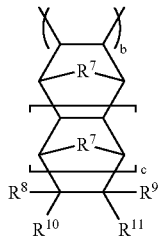

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or —$SO_2$—; $R^8$, $R^9$, $R^{10}$ and $R^{11}$ are the same or different and are a hydrogen atom, a fluorine atom, a hydroxyl group, —$OR^{13}$, —$CO_2R^{13}$, —$R^{12}$—$OR^{13}$ or —$R^{12}$—$CO_2R^{13}$, at least one of $R^8$, $R^9$, $R^{10}$ and $R^{11}$ including —$OR^{13}$, —$CO_2R^{13}$, —$R^{12}$—$OR^{13}$ or —$R^{12}$—$CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1.

In the first pattern formation method of this invention, the base polymer has a sulfonamide group on the side chain of the first unit, and hence, a sulfur atom included in the sulfonamide group has positive polarity while an oxygen atom included in the sulfonamide group has negative polarity. Therefore, the first unit having the sulfonamide group has a high hydrophilic property. Accordingly, the substrate adhesiveness of the resist film is improved and the resist film is free from swelling and is good at developer solubility, and hence, the resist pattern can be formed in a good shape. Also, since the base polymer has the sulfonamide group on the side chain of the first unit, although it includes two sulfur-oxygen double bonds, it has high transmittance against exposing light of a wavelength not longer than a 300 nm band. Furthermore, since the base polymer has a benzene ring on the side chain of the second unit, the dry etching resistance can be improved.

The second pattern formation method of this invention includes the steps of forming a resist film containing a base polymer including a polymer compound having a first unit represented by a general formula of the following Chemical Formula 26 and a second unit represented by a general formula of the following Chemical Formula 27; supplying a liquid onto the resist film; irradiating selectively the resist film, on which the liquid is provided, with exposing light of a wavelength not shorter than a 100 nm band and not longer than a 300 nm band or not shorter than a 1 nm band and not longer than a 30 mn band or electron beams; and developing the resist film after the pattern exposure:

Chemical Formula 26:

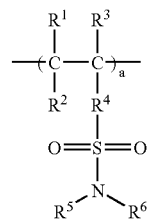

Chemical Formula 27:

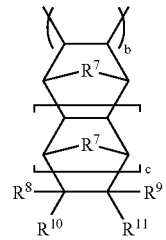

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or —$SO_2$—; $R^8$, $R^9$, $R^{10}$ and $R^{11}$ are the same or different and are a hydrogen atom, a fluorine atom, a hydroxyl group, —$OR^{13}$, —$CO_2R^{13}$, —$R^{12}$—$OR^{13}$ or —$R^{12}$—$CO_2R^{13}$, at least one of $R^8$, $R^9$, $R^{10}$ and $R^{11}$ including —$OR^{13}$, —$CO_2R^{13}$, —$R^{12}$—$OR^{13}$ or —$R^{12}$—$CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1.

In the second pattern formation method of this invention, the step of performing the pattern exposure is carried out by employing immersion lithography, and hence, the resolution of the resist film is improved. In the immersion lithography, a region between a condensing lens and a resist film formed on a wafer in an exposure system is filled with a liquid having a refractive index higher than that of the air. Thus, theoretically, the NA (numerical aperture of a lens) of the exposure system can be increased to the refractive index of the liquid at its best, resulting in improving the solution of the resist film. Also, the focal depth can be increased by this method.

Specific effects obtained in this invention are as follows: Since the base polymer of the resist material has a sulfonamide group on the side chain in this invention, high resolution can be attained by employing the immersion lithography in particular. In a sulfonamide group, an oxygen atom having a strong negative property and large polarity and a sulfur atom are bonded through a double bond and a nitrogen atom that easily attains a positive polarity is bonded to the sulfur atom. Therefore, free electrons on the oxygen atom not related to the bond with the sulfur atom are present in a delocalized state. In other words, the sulfonamide group is a substituent group having high polarity, and therefore, when the base polymer includes a vinyl sulfonamide unit as in this invention, there are a plurality of sulfonamide groups on the side chain. Accordingly, electronic interaction (chemical interaction) is caused between an oxygen atom having a strong negative property of a sulfonamide group bonded to a side chain of one base polymer and a nitrogen atom having a strong positive property of a sulfonamide group bonded to a side chain of another base polymer, resulting in causing strong interaction between the base polymers included in the resist film.

Accordingly, even when the liquid is provided on the resist film in the exposure employing the immersion lithography, the strong interaction caused within the resist film brings a force for mutually holding substances included in the resist film. Therefore, a substance included in the resist film is minimally eluted from the resist film into the liquid. Also, the substituent groups are already bonded to one another through the chemical interaction within the base polymer included in the resist film, interaction is minimally caused between constituting molecules of the liquid employed in the exposure by the immersion lithography and the base polymer. Therefore, the liquid can be prevented from invading the resist film. As a result, high resolution peculiar to the exposure by the immersion lithography can be kept and the solubility in a developer can be high, so that stable pattern formation can be carried out.

In the first or second pattern formation method of the invention, the resist material preferably further includes an acid generator for generating an acid through irradiation with light.

Thus, the aforementioned effects can be realized in pattern formation using a positive chemically amplified resist material.

In the first or second pattern formation method of the invention, the resist material preferably further includes a dissolution inhibitor for inhibiting dissolution of the base polymer.

Thus, the dissolution contrast of the resist film is improved.

In the first or second pattern formation method of the invention, the second unit is preferably represented by the following Chemical Formula 28:

Chemical Formula 28:

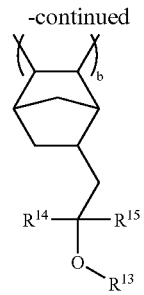

-continued wherein $R^{13}$ is a hydrogen atom, a straight-chain alkyl group, a branched or cyclic alkyl group or a fluoridated alkyl group with a carbon number not less than 1 and not more than 20, or a protecting group released by an acid; $R^{14}$ and $R^{15}$ are trifluoromethyl groups; and b is 1.

Since the second unit includes a trifluoromethyl group in this manner, the transparency can be further improved.

In the first or second pattern formation method of the invention, the polymer compound preferably further includes a third unit represented by a general formula of the following Chemical Formula 29:

Chemical Formula 29:

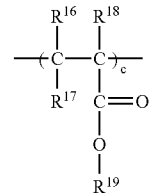

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$.

In the first or second pattern formation method of the invention, the protecting group released by an acid is preferably an acetal group.

Thus, since an acetal group includes an ether bond and has an unpaired electron pair on an oxygen atom, it has high reactivity against an acid. In other words, it needs smaller activation energy for reacting with an acid. Therefore, the protecting group of the acetal group can be easily released by an acid.

In the first or second pattern formation method of the invention, the exposing light may be KrF laser, ArF laser, $F_2$ laser, $Kr_2$ laser, KrAr laser, $Ar_2$ laser or soft X-rays.

In this manner, the polymer compound of this invention has a sulfonamide group (a $SO_2N$ group) on the side chain of the first unit, and a sulfur atom (S) included in the sulfonamide group has positive polarity and an oxygen atom (O) included in the sulfonamide group has negative polarity. Therefore, the first unit including the sulfonamide group has a high hydrophilic property. Also, since the polymer compound of the invention has a sulfonamide group on the side chain of the first unit, the transparency is also improved. Furthermore, since the second unit has a benzene ring on the side chain, the dry etching resistance can be improved. In addition, the present invention is effective in pattern formation employing the immersion lithography.

DETAILED DESCRIPTION OF THE INVENTION

Embodiment 1

Figure 1A:
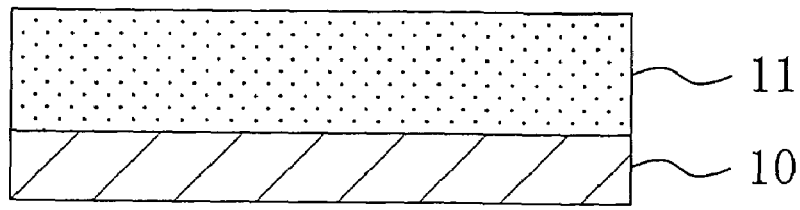
FIGS. 1A, 1B, 1C and 1D are cross-sectional views for showing procedures in a pattern formation method of Examples 1 through 3 for embodying Embodiment 5 of the invention.

A polymer compound according to Embodiment 1 of the invention will now be described.

The polymer compound of Embodiment 1 includes a first unit represented by a general formula shown as Chemical Formula 30 below and a second unit represented by a general formula shown as Chemical Formula 31 below. The polymer compound of Embodiment 1 has a weight-average molecular weight not less than 1,000 and not more than 500,000 and preferably not less than 2,000 and not more than 100,000.

Chemical Formula 30:

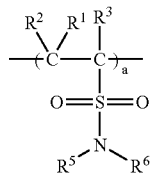

Chemical Formula 31:

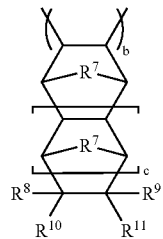

In Chemical Formulas 30 and 31, $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or $-SO_2-$; $R^8$, $R^9$, $R^{10}$ and $R^{11}$ are the same or different and are a hydrogen atom, a fluorine atom, a hydroxyl group, $-OR^{13}$, $-CO_2R^{13}$, $-R^{12}-OR^{13}$ or $-R^{12}-CO_2R^{13}$, at least one of $R^8$, $R^9$, $R^{10}$ and $R^{11}$ including $-OR^{13}$, $-CO_2R^{13}$, $-R^{12}-OR^{13}$ or $-R^{12}-CO_2R^{13}$ (wherein $R^{12}$ is a straight-chain alkylene group, a branched or cyclic alkylene group or a fluoridated alkylene group with a carbon number not less than 1 and not more than 20, and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1. The straight-chain alkyl group, branched or cyclic alkyl group or fluoridated alkyl group with a carbon number not less than 1 and not more than 20 used as $R^{13}$ may or may not include a hydrophilic group such as a hydroxyl group. It is noted that when the polymer compound of Embodiment 1 is used in a chemically amplified resist material, at least one of $R^5$ and $R^6$ is a protecting group released by an acid.

Furthermore, $R^3$ of Chemical Formula 30 is preferably a trifluoromethyl group. Thus, the transparency can be further improved.

Also, the second unit is preferably represented by Chemical Formula 32 below.

Chemical Formula 32:

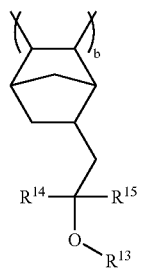

wherein $R^{13}$ is a hydrogen atom, a straight-chain alkyl group, a branched or cyclic alkyl group or a fluoridated alkyl group with a carbon number not less than 1 and not more than 20, or a protecting group released by an acid; and $R^{14}$ and $R^{15}$ are trifluoromethyl groups; and b is 1. The straight-chain alkyl group, branched or cyclic alkyl group or fluoridated alkyl group with a carbon number not less than 1 and not more than 20 used as $R^{13}$ may or may not include a hydrophilic group such as a hydroxyl group.

Since the second unit includes a trifluoromethyl group in this manner, the transparency can be further improved.

Furthermore, the polymer compound including the first unit represented by the general formula of Chemical Formula 30 and the second unit represented by the general formula of Chemical Formula 31 preferably further includes a third unit represented by a general formula shown as Chemical Formula 33 below.

Chemical Formula 33:

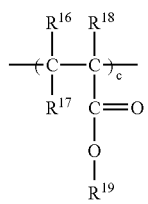

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$. The straight-chain alkyl group, branched or cyclic alkyl group or fluoridated alkyl group with a carbon number not more less than 1 and not more than 20 used as $R^{19}$ may or may not include a hydrophilic group such as a hydroxyl group.

Since $R^{19}$ of the third unit is a hydrogen atom or the like as described above, the solubility is high and hence the dissolution contrast can be improved. Furthermore, since the third unit has an ester bond with a high hydrophilic property, the substrate adhesiveness can be improved. Moreover, when $R^9$ is selected so as to attain a desired function, the dissolution contrast and the substrate adhesiveness can be further improved and the dry etching resistance can be improved.

Also, $R^{18}$ of Chemical Formula 33 is preferably a trifluoromethyl group. Thus, the transparency can be further improved.

Embodiment 2

A polymer compound according to Embodiment 2 of the invention will now be described.

The polymer compound of Embodiment 2 includes a first unit represented by a general formula shown as Chemical Formula 34 below and a second unit represented by a general formula shown as Chemical Formula 35 below. The polymer compound of Embodiment 2 has a weight-average molecular weight not less than 1,000 and not more than 500,000 and preferably not less than 2,000 and not more than 100,000.

Chemical Formula 34:

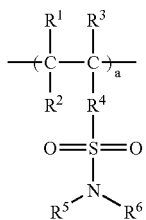

Chemical Formula 35:

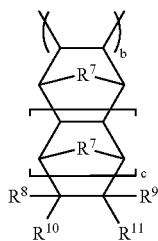

In Chemical Formulas 34 and 35, $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 1 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or $-SO_2-$; $R^8$, $R^9$, $R^{10}$ and $R^{11}$ are the same or different and are a hydrogen atom, a fluorine atom, a hydroxyl group, $-OR^{13}$, $-CO_2R^{13}$, $-R^{12}-OR^{13}$ or $-R^{12}-CO_2R^{13}$, at least one of $R^8$, $R^9$, $R^{10}$ and $R^{11}$ including $-OR^{13}$, $-CO_2R^{13}$, $-R^{12}-OR^{13}$ or $-R^{12}-CO_2R^{13}$ (wherein $R^{12}$ is a straight-chain alkylene group, a branched or cyclic alkylene group or a fluoridated alkylene group with a carbon number not less than 1 and not more than 20, and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1. The straight-chain alkyl group, branched or cyclic alkyl group or fluoridated alkyl group with a carbon number not less than 1 and not more than 20 used as $R^{13}$ may or may not include a hydrophilic group such as a hydroxyl group. It is noted that when the polymer compound of Embodiment 2 is used in a chemically amplified resist material, at least one of $R^5$ and $R^6$ is a protecting group released by an acid.

Also, $R^3$ of Chemical Formula 34 is preferably a trifluoromethyl group. Thus, the transparency can be further improved.

Furthermore, the second unit is preferably represented by Chemical Formula 36 below.

Chemical Formula 36:

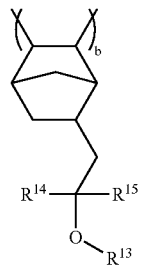

wherein $R^{13}$ is a hydrogen atom, a straight-chain alkyl group, a branched or cyclic alkyl group or a fluoridated alkyl group with a carbon number not less than 1 and not more than 20, or a protecting group released by an acid; $R^{14}$ and $R^{15}$ are trifluoromethyl groups; and b is 1. The straight-chain alkyl group, branched or cyclic alkyl group or fluoridated alkyl group with a carbon number not less than 1 and not more than 20 used as $R^{13}$ may or may not include a hydrophilic group such as a hydroxyl group.

Since the second unit thus includes a trifluoromethyl group, the transparency can be further improved.

The polymer compound including the first unit represented by the general formula of Chemical Formula 34 and the second unit represented by the general formula of Chemical Formula 35 preferably further includes a third unit represented by a general formula shown as Chemical Formula 37 below.

Chemical Formula 37:

-continued

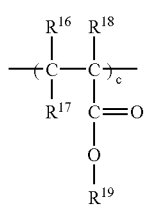

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$. The straight-chain alkyl group, branched or cyclic alkyl group or fluoridated alkyl group with a carbon number not less than 1 and not more than 20 used as $R^{19}$ may or may not include a hydrophilic group such as a hydroxyl group.

Since $R^{19}$ of the third unit is a hydrogen atom or the like as described above, the solubility is improved so as to improve the dissolution contrast. Also, since the third unit has an ester bond with a high hydrophilic property, the substrate adhesiveness can be improved. Furthermore, when $R^{19}$ is selected so as to attain a desired function, the dissolution contrast and the substrate adhesiveness can be further improved and the dry etching resistance can be improved.

Also, $R^{18}$ of Chemical Formula 37 is preferably a trifluoromethyl group. Thus, the transparency can be further improved.

In Embodiment 1 or 2, in the polymer compound including the first unit and the second unit or the polymer compound including the first unit, the second unit and the third unit, specific examples of the straight-chain alkyl group or the branched or cyclic alkyl group with a carbon number not less than 1 and not more than 20 are a methyl group, an ethyl group, a propyl group, an isopropyl group, a n-propyl group, a n-butyl group, a sec-butyl group, a tert-butyl group, a cyclopentyl group, a cyclohexyl group, a cyclohexymethyl group, a 2-ethylhexyl group, a n-octyl group, a 2-adamantyl group and a (2-adamantyl)methyl group. In any of these groups, the carbon number is preferably not less than 1 and not more than 12 and is more preferably not less than 1 and not more than 10.

Also, in the polymer compound including the first unit and the second unit or the polymer compound including the first unit, the second unit and the third unit, the fluoridated alkyl group may be any of the aforementioned alkyl groups in which fluorine atoms are substituted for part or whole of hydrogen atoms, and specific examples are a trifluoromethyl group, a 2,2,2-trifluoroethyl group, a 3,3,3-trifluoropropyl group, a 1,1,1,3,3,3-hexafluoroisopropyl group, a 1,1,2,2,3,3-heptafluoropropyl group, and groups represented by respective general formulas shown in Chemical Formula 38 below.

Chemical Formula 38:

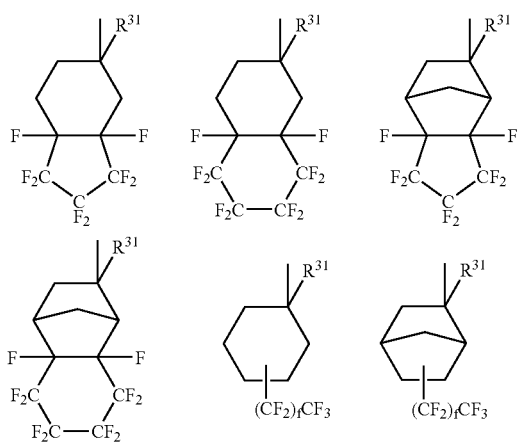

In Chemical Formula 38, $R^{31}$ is a hydrogen atom, a fluorine atom, or a straight-chain alkyl group, a branched or cyclic alkyl group or a fluoridated alkyl group with a carbon number not less than 1 and not more than 20; and f is an integer not less than 0 and not more than 10.

Now, the protecting group released by an acid (that is, $R^5$, $R^6$ or $R^{19}$) used in the polymer compound including the first unit and the second unit or the polymer compound including the first unit, the second unit and the third unit will be described. As the protecting group, any of various groups can be used and in particular, a group represented by a general formula shown as Chemical Formula 39, 40 or 41 below is preferably used.

Chemical Formula 39:

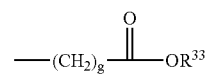

Chemical Formula 40:

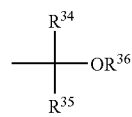

Chemical Formula 41:

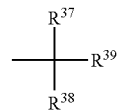

The general formula shown as Chemical Formula 39 will now be described.

In Chemical Formula 39, $R^{33}$ is a tertiary alkyl group with a carbon number not less than 4 and not more than 20 and preferably not less than 4 and not more than 15, an oxoalkyl group with a carbon number not less than 4 and not more than 20, or a group represented by Chemical Formula 41. Specific examples of the tertiary alkyl group are a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, a 2-methyl-2-adamantyl group, etc. Specific examples of the oxoalkyl group are a 3-oxocyclohexyl group, a 4-methyl-2- oxooxane-4-il group and a 5-methyl-5-oxooxolane-4-il group. Also, g is an integer not less than 0 and not more than 6.

Specific examples of the protecting group represented by Chemical Formula 39 are a tert-butoxycarbonyl group, a tert-butoxycarbonylmethyl group, a tert-amyloxycarbonyl group, a tert-amyloxycarbonylmethyl group, a 1,1-diethyl-propyloxycarbonyl group, a 1,1-diethylpropyloxycarbonyl-methyl group, a 1-ethylcyclopentyloxycarbonyl group, a 1-ethylcyclopentyloxycarbonylmethyl group, a 1-ethyl-2-cyclopentenyloxycarbonyl group, a 1-ethyl-2-cyclopenteny-loxycarbonylmethyl group, a 1-ethoxyethoxycarbonylm-ethyl group, a 2-tetrahydropyranyloxycarbonylmethyl group, a 2-tetrahydroftiranyloxycarbonylmethyl group, etc.

Now, the general formula shown as Chemical Formula 40 will be described.

In Chemical Formula 40, $R^{34}$ and $R^{35}$ are the same or different and are a hydrogen atom, or a straight-chain alkyl group or a branched or cyclic alkyl group with a carbon number not less than 1 and not more than 18 and preferably not less than 1 and not more than 10. Specific examples are a methyl group, an ethyl group, a propyl group, an isopropyl group, a n-butyl group, a sec-butyl group, a tert-butyl group, a cyclopentyl group, a cyclohexyl group, a 2-ethylhexyl group and a n-octyl group.

Furthermore, in Chemical Formula 40, $R^{36}$ is a univalent carbon hydride group (which may include a hetero atom such as an oxygen atom) with a carbon number not less than 1 and not more than 18 and preferably not less than 1 and not more than 10, and may be a straight-chain, branched or cyclic alkyl group, or such an alkyl group in which hydroxyl groups, alkoxy groups, oxo groups, amino groups or alky-lamino groups are substituted for part of hydrogen atoms. Specific examples of $R^{36}$ are substituted alkyl groups shown in Chemical Formula 42 below.

Chemical Formula 42:

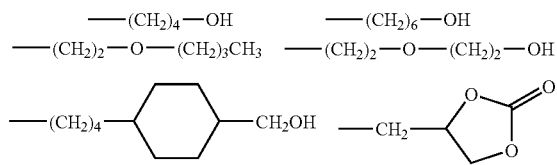

In Chemical Formula 40, each of pairs of $R^{34}$ and $R^{35}$, $R^{34}$ and $R^{36}$, and $R^{35}$ and $R^{36}$ may be mutually bonded to form a ring. When they form a ring, each of $R^{34}$, $R^{35}$ and $R^{36}$ is a straight-chain or branched alkylene group with a carbon number not less than 1 and not more than 18 and more preferably not less than 1 and not more than 10.

In the protecting group represented by Chemical Formula 40, specific examples of the straight-chain or branched alkylene group are groups shown in Chemical Formula 43 below:

Chemical Formula 43:

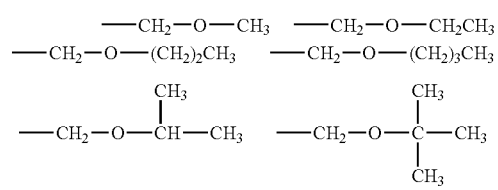

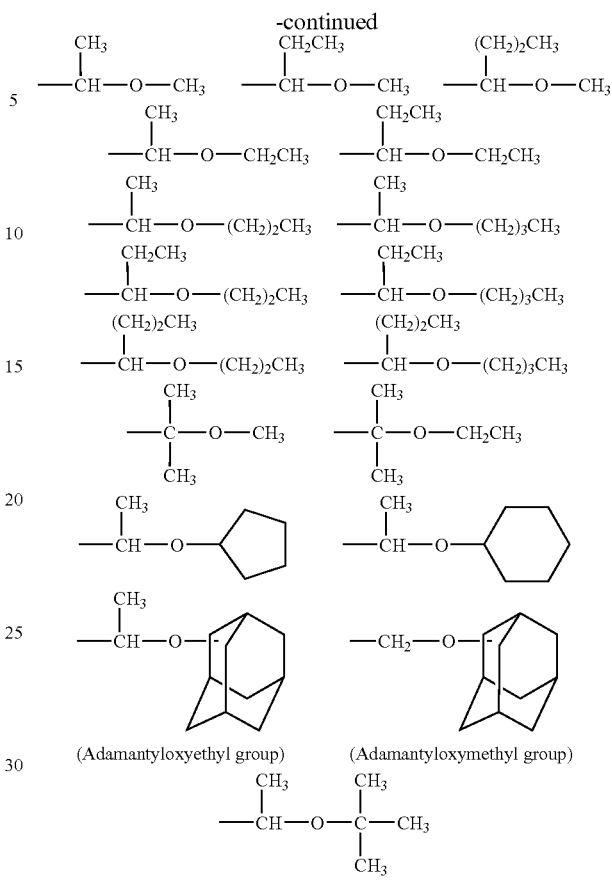

Also, in the protecting group represented by Chemical Formula 40, specific examples of the cyclic alkylene group are a tetrahydropyran-2-il group, a 2-methyltetrahydrofuran-2-il group, a tetrahydropyran-2-il group and a 2-methyltet-rahydropyran-2-il group.

As the protecting group represented by Chemical Formula 40, an ethoxyethyl group, a butoxyethyl group, an ethox-ypropyl group, an adamantyloxyethyl group or an adaman-tyloxymethyl group is preferably used.

Now, the general formula shown as Chemical Formula 41 will be described.

In Chemical Formula 41, each of $R^{37}$, $R^{38}$ and $R^{39}$ is a univalent carbon hydride group such as a straight-chain alkyl group or a branched or cyclic alkyl group with a carbon number not less than 1 and not more than 20, and may include a hetero atom such as oxygen, sulfur, nitrogen or fluorine.

In Chemical Formula 41, each of pairs of $R^{37}$ and $R^{38}$, $R^{37}$ and $R^{39}$, and $R^{38}$ and $R^{39}$ may be mutually bonded to form a ring together with a carbon atom bonded to these groups.

Specific examples of a tertiary alkyl group represented by Chemical Formula 41 are a tert-butyl group, a triethylcarbyl group, a 1-ethylnorbornyl group, a 1-methylcyclohexyl group, a 1-ethylcyclopentyl group, a 2-(2-methyl)adamantyl group, a 2-(2-ethyl)adamantyl group, a tert-amyl group, a 1,1,1,3,3,3-hexafluoro-2-methyl-isopropyl group, a 1,1,1,3, 3,3-hexafluoro-2-cyclohexyl-isopropyl group and groups shown in Chemical Formula 44 below.

Chemical Formula 44:

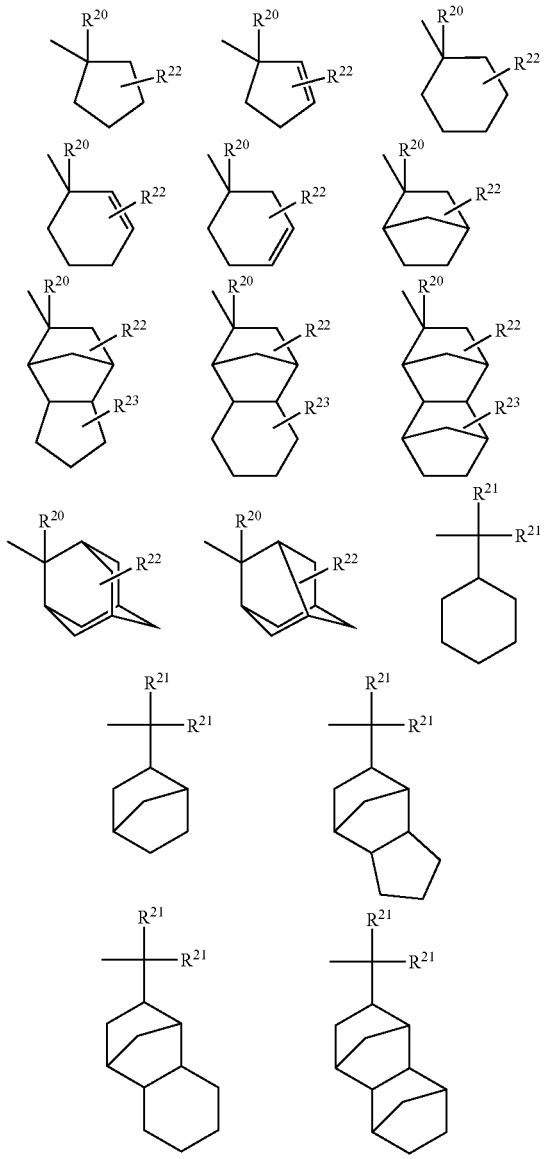

In Chemical Formula 44, $R^{20}$ is a straight-chain, branched or cyclic alkyl group with a carbon number not less than 1 and not more than 6, and specific examples are a methyl group, an ethyl group, a propyl group, an isopropyl group, a n-butyl group, a sec-butyl group, a n-pentyl group, a n-hexyl group, a cyclopropyl group, a cyclopropylmethyl group, a cyclobutyl group, a cyclopentyl group and a cyclohexyl group.

Also, in Chemical Formula 44, $R^{21}$ is a straight-chain, branched or cyclic alkyl group with a carbon number not less than 2 and not more than 6, and specific examples are an ethyl group, a propyl group, an isopropyl group, a n-butyl group, a sec-butyl group, a n-pentyl group, a n-hexyl group, a cyclopropyl group, a cyclopropylmethyl group, a cyclobutyl group, a cyclopentyl group and a cyclohexyl group.

Furthermore, in Chemical Formula 44, $R^{22}$ and $R^{23}$ are the same or different and are a hydrogen atom or a univalent carbon hydride group (which may include a hetero atom or may be bonded through a hetero atom) with a carbon number not less than 1 and not more than 6, and may be any of straight-chain, branched and cyclic groups. In this case, examples of the hetero atom are an oxygen atom, a sulfur atom, a nitrogen atom, —OH, —$OR^{24}$, —O—, —S—, —S(=O)—, —$NH_2$, —$NHR^{24}$, —$N(R^{24})_2$, —NH— and —$NR^{24}$—, wherein $R^{24}$ is an alkyl group.

Specific examples of $R^{22}$ and $R^{23}$ used in Chemical Formula 44 are a methyl group, a hydroxymethyl group, an ethyl group, a hydroxyethyl group, a propyl group, an isopropyl group, a n-butyl group, a sec-butyl group, a n-pentyl group, a n-hexyl group, a methoxy group, a methoxymethoxy group, an ethoxy group and a tert-butoxy group.

Embodiment 3

A resist material according to Embodiment 3 of the invention will now be described.

The resist material of Embodiment 3 includes, as a base polymer, the polymer compound according to Embodiment 1 or 2.

It is noted that the resist material of Embodiment 3 may include another polymer compound for the purpose of changing dynamical, thermal or other properties of a resultant resist film. In this case, the polymer compound to be additionally included is not particularly specified, and may be included so that the polymer compound according to Embodiment 1 or 2 can occupy a proportion of 50 through 70% in the whole base polymer.

Embodiment 4

A positive chemically amplified resist material according to Embodiment 4 of the invention will now be described.

The chemically amplified resist material of Embodiment 4 includes the polymer compound according to Embodiment 1 or 2 as a base polymer and also includes an acid generator and an organic solvent. Furthermore, the chemically amplified resist material of Embodiment 6 includes a basic compound serving as a buffer or an agent for improving dissolution contrast, or a dissolution inhibitor serving as an agent for improving dissolution contrast.

Specific examples of the acid generator are diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, etc. In this case, one of these acid generators may be singly used or a combination of two or more of them may be used.

The content of the acid generator is preferably 0.2 through 15 parts by weight based on 100 parts by weight of the base polymer. When the content of the acid generator is smaller than 0.2 part by weight based on 100 parts by weight of the base polymer, the amount of acid generated in exposure is too small to attain high sensitivity and high resolution, and when it is larger than 15 parts by weight based on 100 parts by weight of the base polymer, the transparency may be so low that the resolution is lowered.

As the basic compound, a compound capable of suppressing a diffusing rate of an acid generated from the acid generator diffusing within a resultant resist film is suitably used. When the basic compound is included in the chemically amplified resist material, the diffusing rate of the acid within the resist film is suppressed and hence the resolution is improved. Therefore, exposure margin or pattern profile can be improved by suppressing sensitivity change through the exposure or by reducing dependency on a substrate or environment.

Specific examples of the basic compound are ammonia, primary, secondary or tertiary aliphatic amines, mixed amines, aromatic amines, heterocyclic amines, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, an amide derivative, an imide derivative, etc.

As the dissolution inhibitor, a compound with a molecular weight of 3,000 or less and preferably of 2,500 or less whose solubility in an alkaline developer is changed by a function of an acid is preferably used, and specifically, a compound including phenol, a carboxylic acid derivative or hexafluoroisopropanol in which acid labile groups are substituted for part or whole of hydroxyl groups is suitably used.

The content of the dissolution inhibitor is preferably 20 parts by weight or less and more preferably 15 parts by weight or less based on 100 parts by weight of the base polymer included in the resist material. When the content is larger than 20 parts by weight based on 100 parts by weight of the base polymer, the content of a monomer component is so large that the heat resistance of the resist material is lowered.

The resist material of Embodiment 4 may include another polymer compound for the purpose of changing dynamical, thermal, alkali-soluble or other properties of a resultant resist film. In this case, the polymer compound to be additionally included is not particularly specified, and may be mixed with the polymer compound according to Embodiment 1 or 2 in an appropriate rate.

Embodiment 5

A pattern formation method according to Embodiment 5 of the invention will now be described.

In the pattern formation method of Embodiment 5, the resist material according to Embodiment 3 or 4 is used, and the pattern formation method includes the following procedures:

First, the resist material according to Embodiment 3 or 4 is applied on a substrate such as a silicon wafer in a thickness of 0.1 through 1.0 μm by spin coating or the like. Thereafter, the resultant substrate is subjected to pre-bake by using a hot plate at a temperature of 60 through 200° C. for 10 seconds through 10 minutes and preferably at a temperature of 80 through 150° C. for 30 seconds through 5 minutes. Thus, a resist film is formed.

Next, the resist film is irradiated through a photomask having a desired pattern with high energy beams such as deep UV, excimer laser or X-rays, or electron beams at exposure of approximately 1 through 200 mJ/cm² and preferably approximately 10 through 100 mJ/cm². Thereafter, the resultant is subjected to post-exposure bake (PEB) by using a hot plate at a temperature of 60 through 150° C. for 10 seconds through 5 minutes and preferably at a temperature of 80 through 130° C. for 30 seconds through 3 minutes.

Next, the resultant resist film is developed by using a developer of an alkaline aqueous solution, such as tetramethylammonium hydroxide (TMAH), with a concentration of 0.1 through 5% and preferably 2 through 3% for 10 seconds through 3 minutes and preferably 30 seconds through 2 minutes. Thus, a resist pattern is formed. For this development, any of known methods such as a dip method, a puddle method and a spray method can be employed.

In Embodiment 5, the exposing light may be deep UV or excimer laser of a wavelength of a 254 nm through 120 nm band, and in particular, high energy beams such as KrF laser of a wavelength of a 248 nm band, ArF laser of a wavelength of a 193 nm band, F₂ laser of a wavelength of a 157 nm band, Kr₂ laser of a wavelength of a 146 nm band, KrAr laser of a wavelength of a 134 nm band, Ar₂ laser of a wavelength of a 126 nm band or soft X-rays, or electron beams. Thus, a fine resist pattern can be formed.

Now, a specific exemplified experiment practiced for evaluating the pattern formation method of Embodiment 5 embodied as described in Examples 1 through 3 below will be described with reference to FIG. 2.

Figure 2:
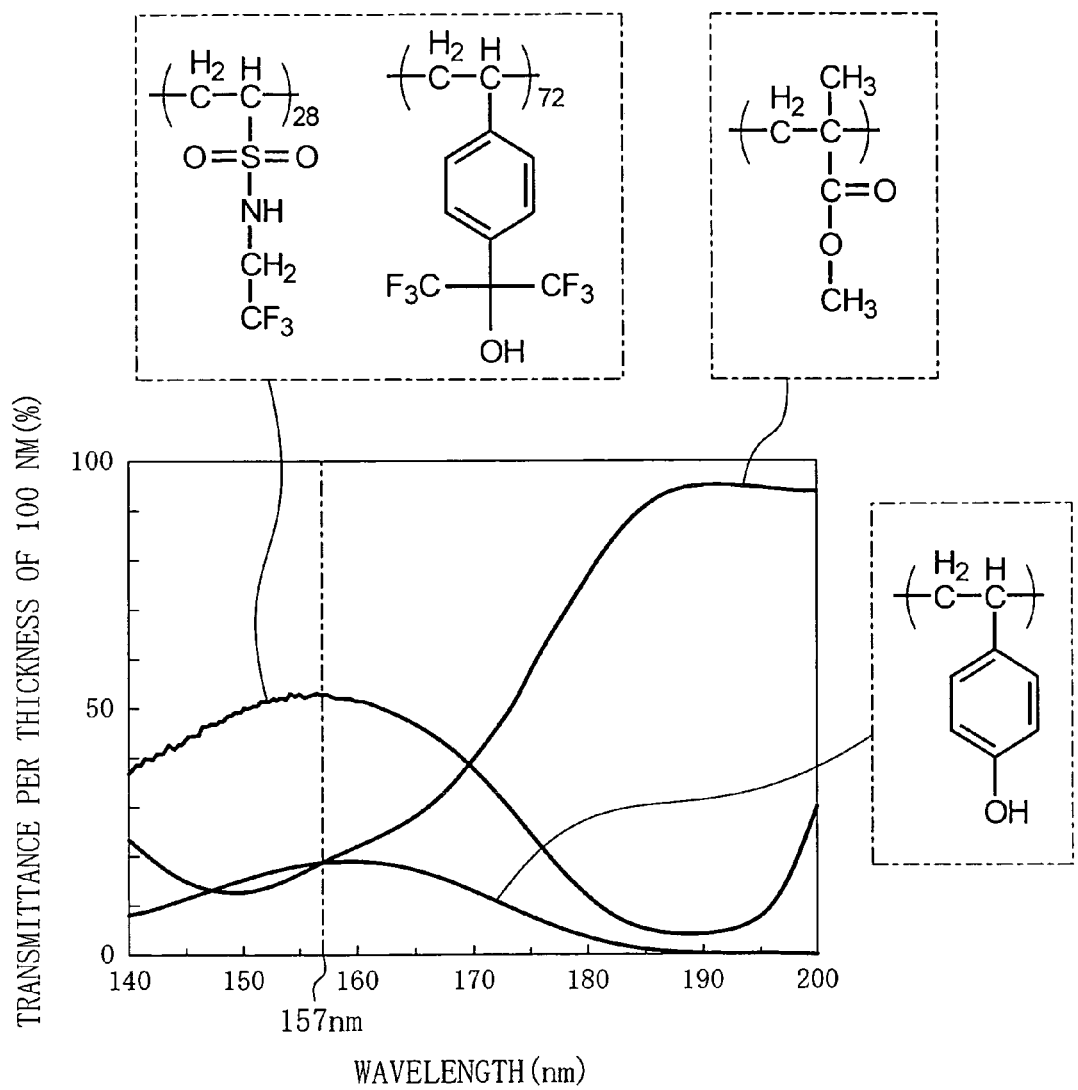
FIG. 2 is a diagram for showing an exemplified experiment performed for evaluating the pattern formation method of Embodiment 5.

As is understood from FIG. 2, in the pattern formation method of Embodiment 5, the transmittance at a wavelength band of 157 nm is largely improved as compared with the case where poly(vinylphenol) or methyl methacrylate is used as a base polymer.

EXAMPLE 1

Example 1 for embodying the chemically amplified resist material of Embodiment 4 and the pattern formation method of Embodiment 5 will now be described with reference to FIGS. 1A through 1D.

First, a chemically amplified resist material having the following composition is prepared:

Base polymer: polymer in which a first unit represented by Chemical Formula 45 and a second unit represented by Chemical Formula 46 are polymerized Acid generator: triphenylsulfonium nonaflate (4 wt % based on the base polymer)

Solvent: propylene glycol monomethyl ether acetate

Chemical Formula 45:

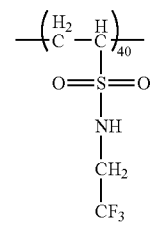

Chemical Formula 46:

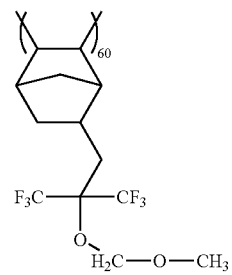

Next, as shown in FIG. 1A, the chemically amplified resist material having the above-described composition is applied on a semiconductor substrate 10 by spin coating, thereby forming a resist film 11 with a thickness of 0.2 μm. At this point, since the base polymer is alkali-insoluble, the resist film 11 is alkali-insoluble.

Figure 1B:
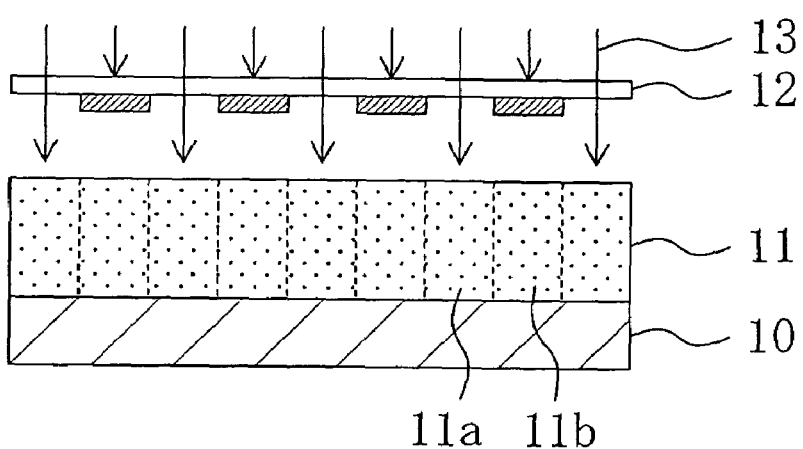

Next, as shown in FIG. 1B, the resist film 11 is subjected to pattern exposure by irradiating through a mask 12 with exposing light 13 of F₂ laser (of a wavelength of a 157 nm band). Thus, an acid is generated from the acid generator in an exposed portion 11a of the resist film 11 while no acid is generated in an unexposed portion 11b of the resist film 11.

Figure 1C:
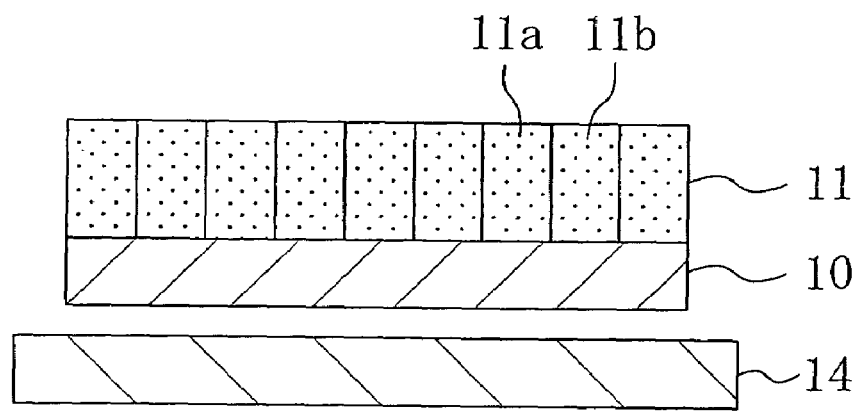

Then, as shown in FIG. 1C, the semiconductor substrate 10 together with the resist film 11 is heated with a hot plate 14. Thus, the base polymer is heated in the presence of the acid in the exposed portion 11a of the resist film 11, so as to release a protecting group in the second unit. As a result, the base polymer becomes alkali-soluble.

Figure 1D:
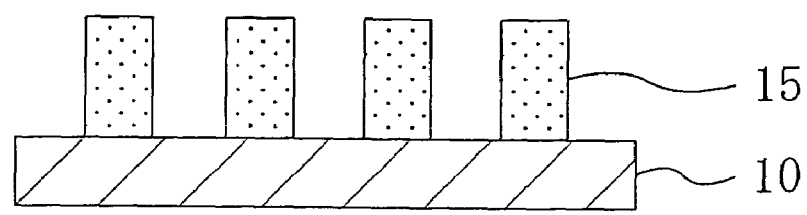

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 made of the unexposed portion 11b of the resist film 11 can be formed as shown in FIG. 1D.

In the pattern exposure shown in FIG. 1B, the resist film 11 may be selectively irradiated with the exposing light 13 with water or a liquid (having a refractive index n) such as perfluoropolyether supplied on the resist film 11. When such immersion lithography is performed, since a region between a condensing lens and the resist film in an exposure system is filled with the liquid having a refractive index n, the value of NA (numerical aperture) of the exposure system becomes a value n·NA, and hence the resolution of the resist film 11 is improved.

EXAMPLE 2

Example 2 for embodying the chemically amplified resist material according to Embodiment 4 and the pattern formation method according to Embodiment 5 will now be described. Though Example 2 is different from Example 1 merely in the chemically amplified resist material, the pattern formation can be performed with the use of the exposing light 13 emitted from a below-mentioned light source. The resist material different from that in Example and the exposing light 13 will be described herein as one example. The other aspects in Example 2 are the same as those in Example 1.

A chemically amplified resist material having the following composition is prepared:

Base polymer: polymer in which a first unit represented by Chemical Formula 47, a second unit represented by Chemical Formula 48 and a third unit represented by Chemical Formula 49 are polymerized Acid generator: triphenylsulfonium triflate (4 wt % based on the base polymer)

Solvent: propylene glycol monomethyl ether acetate

Chemical Formula 47:

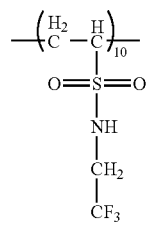

-continued

Chemical Formula 48:

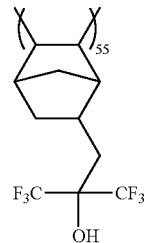

Chemical Formula 49:

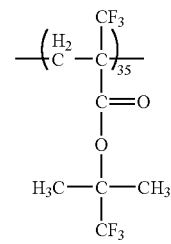

Next, the chemically amplified resist material having the aforementioned composition is applied on a semiconductor substrate 10 by spin coating, so as to form a resist film 11 with a thickness of 0.2 μm. Thereafter, the resist film 11 is subjected to pattern exposure by irradiating through a mask 12 with exposing light 13 of KrF laser (of a wavelength of a 248 nm band).

EXAMPLE 3

Example 3 for embodying the chemically amplified resist material according to Embodiment 4 and the pattern formation method according to Embodiment 5 will now be described. Since Example 3 is different from Example 2 merely in the chemically amplified resist material, the resist material alone will be herein described.

A chemically amplified resist material having the following composition is prepared:

Base polymer: polymer in which a first unit represented by Chemical Formula 50 and a second unit represented by Chemical Formula 51 are polymerized Acid generator: triphenylsulfonium nonaflate (4 wt % based on the base polymer)

Solvent: propylene glycol monomethyl ether acetate

Chemical Formula 50:

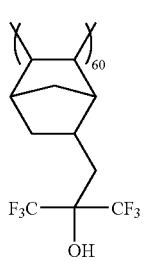

Chemical Formula 51:

-continued

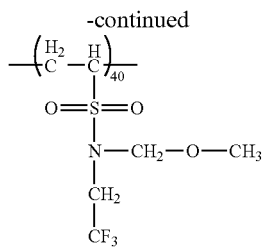

EXAMPLE 4

Example 4 for embodying the chemically amplified resist material according to Embodiment 4 and the pattern formation method according to Embodiment 5 will now be described. Since Example 4 is different from Example 2 merely in the chemically amplified resist material, the resist material alone will be herein described.

A chemically amplified resist material having the following composition is prepared:

Base polymer:
poly(acrylsulfonamide$_{60}$-acrylsulfone-N-adamantyloxy-diethylamide$_{40}$)

Acid generator: triphenylsulfonium triflate (3 wt % based on the base polymer)

Solvent: propylene glycol monomethyl ether acetate

EXAMPLE 5

Example 5 for embodying the chemically amplified resist material according to Embodiment 4 and the pattern formation method according to Embodiment 5 will now be described. Since Example 5 is different from Example 2 merely in the chemically amplified resist material, the resist material alone will be herein described.

A chemically amplified resist material having the following composition is prepared:

Base polymer: poly(acrylsulfone-N-adamantyloxyethylamide)

Acid generator: triphenylsulfonium triflate (3 wt % based on the base polymer)

Solvent: propylene glycol monomethyl ether acetate

Embodiment 6

A pattern formation method according to Embodiment 6 of the invention will now be described.

In the pattern formation method of Embodiment 6, immersion lithography for performing exposure with water provided between a resist film and an exposure lens is carried out by using the resist material according to Embodiment 3 or 4. This pattern formation method includes the following procedures:

First, the resist material according to Embodiment 3 or 4 is applied on a substrate such as a silicon wafer in a thickness of 0.1 through 1.0 μm by spin coating or the like. Thereafter, the resultant substrate is subjected to pre-bake by using a hot plate at a temperature of 60 through 200° C. for 10 seconds through 10 minutes and preferably at a temperature of 80 through 150° C. for 30 seconds through 5 minutes. Thus, a resist film is formed.

Next, with water supplied onto the resist film, the resist film is irradiated through a photomask having a desired pattern with high energy beams such as deep UV, excimer laser or X-rays, or electron beams at exposure of approximately 1 through 200 mJ/cm$^2$ and preferably approximately 10 through 100 mJ/cm$^2$.

Thereafter, the resultant is subjected to post-exposure bake (PEB) by using a hot plate at a temperature of 60 through 150° C. for 10 seconds through 5 minutes and preferably at a temperature of 80 through 130° C. for 30 seconds through 3 minutes.

Next, the resultant resist film is developed by using a developer of an alkaline aqueous solution, such as tetramethylammonium hydroxide (TMAH), with a concentration of 0.1 through 5% and preferably 2 through 3% for 10 seconds through 3 minutes and preferably 30 seconds through 2 minutes. Thus, a resist pattern is formed. For this development, any of known methods such as a dip method, a puddle method and a spray method can be employed.

In Embodiment 6, the exposing light may be deep UV or excimer laser of a wavelength of a 254 nm through 120 nm band, and in particular, high energy beams such as KrF laser of a wavelength of a 248 nm band, ArF laser of a wavelength of a 193 nm band, F$_2$ laser of a wavelength of a 157 nm band, Kr$_2$ laser of a wavelength of a 146 nm band, KrAr laser of a wavelength of a 134 nm band, Ar$_2$ laser of a wavelength of a 126 nm band or soft X-rays, or electron beams. Thus, a fine resist pattern can be formed.

Instead of water, a liquid (having a refractive index n) such as perfluoropolyether may be supplied on the resist film 11 in the pattern exposure for selectively irradiating the resist film with the exposing light. When such immersion lithography is performed, since a region between a condensing lens and the resist film in an exposure system is filled with the liquid having a refractive index n, the value of NA (numerical aperture) of the exposure system becomes a value n·NA, and hence, the resolution of the resist film is improved.

EXAMPLE 6

Example 6 for embodying the chemical amplified resist material according to Embodiment 4 and the pattern formation method according to Embodiment 6 will now be described with reference to FIGS. 3A through 3D.

First, a chemically amplified resist material having the following composition is prepared:

Base polymer: polymer in which a first unit represented by Chemical Formula 52 and a second unit represented by Chemical Formula 53 are polymerized Acid generator: triphenylsulfonium triflate (2 wt % based on the base polymer)

Solvent: propylene glycol monomethyl ether acetate

Chemical Formula 52:

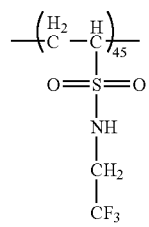

Chemical Formula 53:

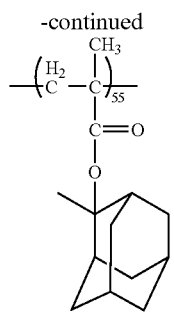

Figure 3A:
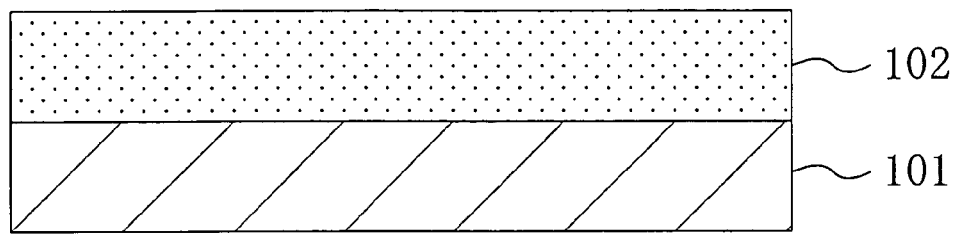
FIGS. 3A, 3B, 3C and 3D are cross-sectional views for showing procedures in a pattern formation method of Example 6 for embodying Embodiment 6 of the invention.

Next, as shown in FIG. 3A, the chemically amplified resist material having the above-described composition is applied on a semiconductor substrate 101 by spin coating, thereby forming a resist film 102 with a thickness of 0.2 μm. At this point, since the base polymer is alkali-insoluble, the resist film 102 is alkali-insoluble.

Figure 3B:
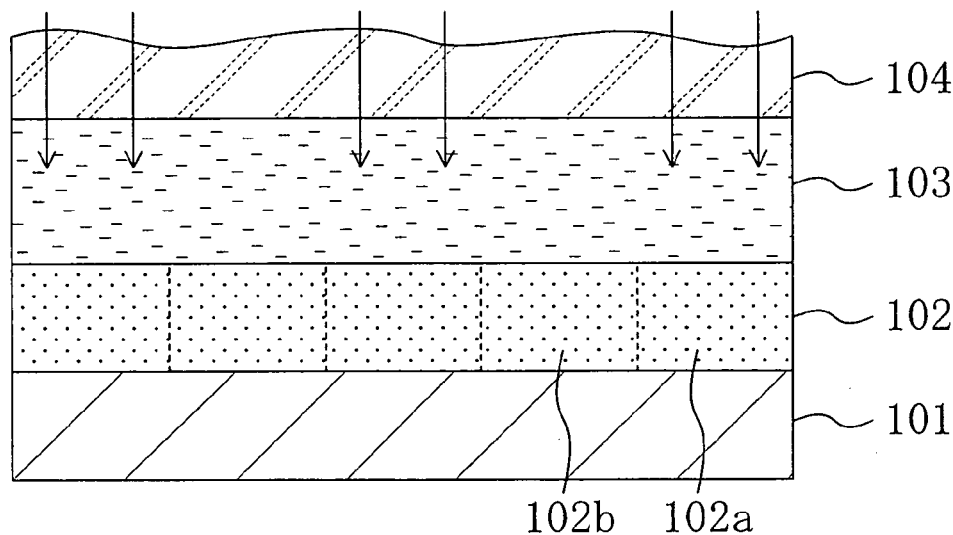

Next, as shown in FIG. 3B, the resist film 102 is subjected to pattern exposure by irradiating through an exposure lens 104 with exposing light of ArF laser (of a wavelength of a 193 nm band) with water 103 (having a refractive index n of 1.44) provided on the resist film 102. Thus, an acid is generated from the acid generator in an exposed portion 102a of the resist film 102 while no acid is generated in an unexposed portion 102b of the resist film 102.

Figure 3C:
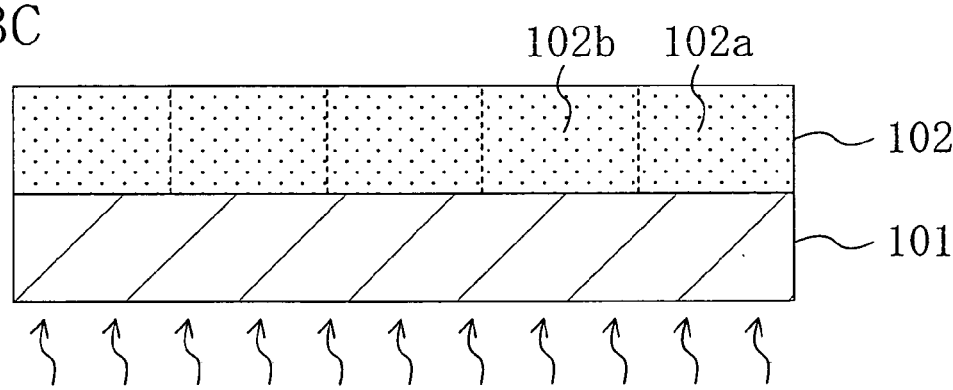

Then, as shown in FIG. 3C, the semiconductor substrate 101 together with the resist film 102 is heated with a hot plate. Thus, the base polymer is heated in the presence of the acid in the exposed portion 102a of the resist film 102, so as to release a protecting group in the second unit. As a result, the base polymer becomes alkali-soluble.

Figure 3D:
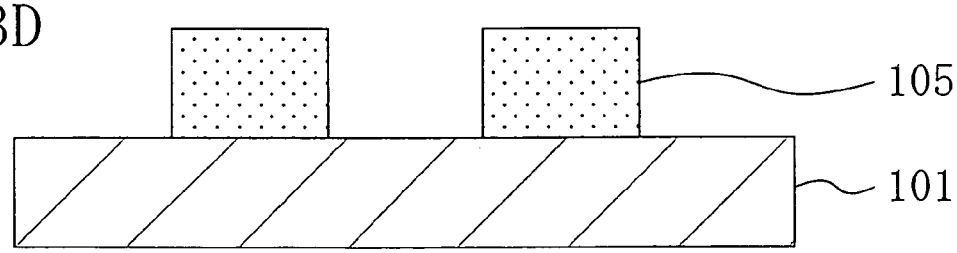

Subsequently, the resist film 102 is developed with an alkaline developer such as a tetramethylammonium hydroxide aqueous solution. Thus, the exposed portion 102a of the resist film 102 is dissolved in the developer, so that a resist pattern 105 made of the unexposed portion 102b of the resist film 102 can be formed as shown in FIG. 3D.

It is noted that the base polymer includes the unit represented by Chemical Formula 52 in a rate of approximately 45% and the unit represented by Chemical Formula 53 in a rate of approximately 55%.

In the case where the base polymer includes a plurality of kinds of units in this manner, the respective units are preferably polymerized in a comparatively homogeneous state. When the different units are well mixed in the base polymer by preventing a given unit from polymerizing locally in a given portion of the base polymer, the respective units can be polymerized in such a manner as to be engaged with one another. Thus, the skeleton strength of the resultant base polymer can be improved. Therefore, the effect to improve the transparency and the hydrophilic property owing to the sulfonamide group can be attained and a base polymer including at least two kinds of units and having high polymerization uniformity can be provided. As a result, a resist pattern with improved etching resistance can be formed in a good shape.

In addition, when the polymerization uniformity of the units used for forming a resist film is improved, particularly in employing the exposure by the immersion lithography, permeation of an immersion liquid into the resist film and elution of components of the resist film into the immersion liquid can be suppressed. This is because, when the polymerization uniformity is high, different kinds of units are engaged with one another so as to be sterically bonded to one another in a resultant polymer structure, and hence, the structure of the resultant resist film is complicated. Accordingly, even in the exposure by the immersion lithography in which the immersion liquid and the resist film are in direct contact with each other, mutual solution of their components can be prevented. As a result, a pattern can be accurately formed.

The resist material or the pattern formation method of this invention is particularly suitable to a method for forming a fine resist pattern by using exposing light of KrF laser, ArF laser, $F_2$ laser, KrAr laser or $Ar_2$ laser.

What is claimed is:

1. A polymer compound comprising a first unit represented by a general formula of the following Chemical Formula 1 and a second unit represented by a general formula of the following Chemical Formula 2 and having a weight-average molecular weight not less than 1,000 and not more than 500,000:

Chemical Formula 1:

Chemical Formula 2:

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or —$SO_2$—; $R^8$, $R^9$, $R^{10}$ and $R^{11}$ are the same or different and are a hydrogen atom, a fluorine atom, a hydroxyl group, —$OR^{13}$, —$CO_2R^{13}$, —$R^{12}$—$OR^{13}$ or —$R^{12}$—$CO_2R^{13}$, at least one of $R^8$, $R^9$, $R^{10}$ and $R^{11}$ including —$OR^{13}$, —$CO_2R^{13}$, —$R^{12}$—$OR^{13}$ or —$R^{12}$—$CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); 0<a<1; 0<b<1; and c is 0 or 1, and wherein $R^3$ of said first unit is a trifluoromethyl group.

2. The polymer compound of claim 1, further comprising a third unit represented by a general formula of the following Chemical Formula 3:

Chemical Formula 3:

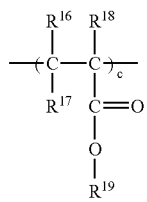

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^9$ is a hydrogen atom, a straight-chain alkyl group, a branched or cyclic alkyl group or a fluoridated alkyl group with a carbon number not less than 1 and not more than 20, or a protecting group released by an acid; and 0<c<1.

3. The polymer compound of claim 1, wherein said protecting group released by an acid is an acetal group.

4. A resist material comprising a base polymer containing a polymer compound including a first unit represented by a general formula of the following Chemical Formula 4 and a second unit represented by a general formula of the following Chemical Formula 5:

Chemical Formula 4:

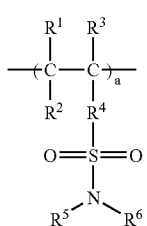

Chemical Formula 5:

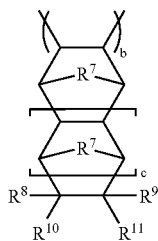

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or $-SO_2-$; $R^8$, $R^9$, $R^{10}$ and $R^{11}$ are the same or different and are a hydrogen atom, a fluorine atom, a hydroxyl group, $-OR^{13}$, $-CO_2R^{13}$, $-R^{12}-OR^{13}$ or $-R^{12}-CO_2R^{13}$, at least one of $R^8$, $R^9$, $R^{10}$ and $R^{11}$ including $-OR^{13}$, $-CO_2R^{13}$, $-R^{12}-OR^{13}$ or $-R^{12}-CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); 0<a<1; 0<b<1; and c is 0 or 1, and wherein $R^3$ of said first unit is a trifluoromethyl group.

5. The resist material of claim 4, further comprising an acid generator for generating an acid through irradiation with light.

6. The resist material of claim 4, wherein said second unit is represented by the following Chemical Formula 6:

Chemical Formula 6:

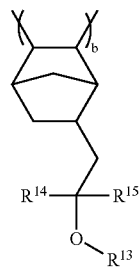

wherein $R^{13}$ is a hydrogen atom, a straight-chain alkyl group, a branched or cyclic alkyl group or a fluoridated alkyl group with a carbon number not less than 1 and not more than 20, or a protecting group released by an acid; $R^{14}$ and $R^{15}$ are trifluoromethyl groups; and 0<b<1.

7. The resist material of claim 4, further comprising a third unit represented by a general formula of the following Chemical Formula 7:

Chemical Formula 7:

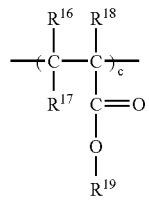

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$.

8. The resist material of claim 7,
wherein $R^{18}$ of said third unit is a trifluoromethyl group.

9. The resist material of claim 4,
wherein said protecting group released by an acid is an acetal group.

10. The resist material of claim 9,
wherein said acetal group is an alkoxyethyl group or an alkoxymethyl group.

11. The resist material of claim 10,
wherein said alkoxyethyl group is an adamantyloxyethyl group, a t-butyloxyethyl group, an ethoxyethyl group or a methoxyethyl group, and
said alkoxymethyl group is an adamantyloxymethyl group, a t-butyloxymethyl group, an ethoxymethyl group or a methoxymethyl group.

12. A pattern formation method comprising the steps of:
forming a resist film containing a base polymer including a polymer compound having a first unit represented by a general formula of the following Chemical Formula 8 and a second unit represented by a general formula of the following Chemical Formula 9;
irradiating selectively said resist film with exposing light of a wavelength not shorter than a 100 nm band and not longer than a 300 nm band or not shorter than a 1 nm band and not longer than a 30 nm band or electron beams; and
developing said resist film after the pattern exposure:

Chemical Formula 8:

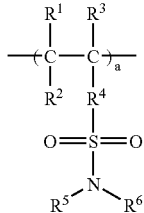

Chemical Formula 9:

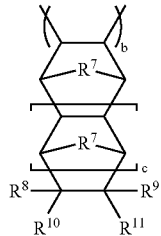

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or $-SO_2-$; $R^8$, $R^9$, $R^{10}$ and $R^{11}$ are the same or different and are a hydrogen atom, a fluorine atom, a hydroxyl group, $-OR^{13}$, $-CO_2R^{13}$, $-R^{12}-OR^{13}$ or $-R^{12}-CO_2R^{13}$, at least one of $R^8$, $R^9$, $R^{10}$ and $R^{11}$ including $-OR^{13}$, $-CO_2R^{13}$, $-R^{12}-OR^{13}$ or $-R^{12}-CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1, and
wherein $R^3$ of said first unit is a trifluoromethyl group.

13. The pattern formation method of claim 12,
wherein said resist material further includes an acid generator for generating an acid through irradiation with light.

14. The pattern formation method of claim 12,
wherein said resist material further includes a dissolution inhibitor for inhibiting dissolution of said base polymer.

15. The pattern formation method of claim 12,
wherein said second unit is represented by the following Chemical Formula 10:

Chemical Formula 10:

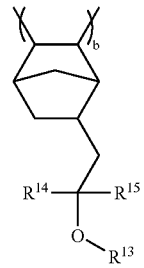

wherein $R^{13}$ is a hydrogen atom, a straight-chain alkyl group, a branched or cyclic alkyl group or a fluoridated alkyl group with a carbon number not less than 1 and not more than 20, or a protecting group released by an acid; $R^{14}$ and $R^{15}$ are trifluoromethyl groups; and $0<b<1$.

16. The pattern formation method of claim 12,
wherein said polymer compound further includes a third unit represented by a general formula of the following Chemical Formula 11:

Chemical Formula 11:

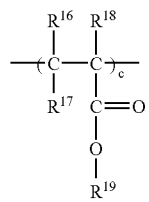

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$.

17. The pattern formation method of claim 12, wherein said protecting group released by an acid is an acetal group.

18. The pattern formation method of claim 12, wherein said exposing light is KrF laser, ArF laser, $F_2$ laser, $Kr_2$ laser, KrAr laser, $Ar_2$ laser or soft X-rays.

19. A pattern formation method comprising the steps of:
forming a resist film containing a base polymer including a polymer compound having a first unit represented by a general formula of the following Chemical Formula 12 and a second unit represented by a general formula of the following Chemical Formula 13;
supplying a liquid onto said resist film;
irradiating selectively said resist film, on which said liquid is provided, with exposing light of a wavelength not shorter than a 100 nm band and not longer than a 300 nm band or not shorter than a 1 nm band and not longer than a 30 nm band or electron beams; and
developing said resist film after the pattern exposure:

Chemical Formula 12:

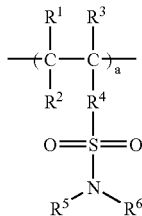

Chemical Formula 13:

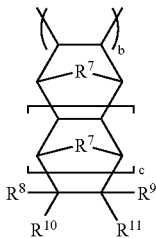

wherein $R^1$, $R^2$ and $R^3$ are the same or different and are a hydrogen atom, a fluorine atom, or a straight-chain alkyl group, a branched or cyclic alkyl group or a fluoridated alkyl group with a carbon number not less than 1 and not more than 20; $R^4$ is a straight-chain alkylene group or a branched or cyclic alkylene group with a carbon number not less than 0 and not more than 20; $R^5$ and $R^6$ are the same or different and are a hydrogen atom, a straight-chain alkyl group, a branched or cyclic alkyl group or a fluoridated alkyl group with a carbon number not less than 1 and not more than 20, or a protecting group released by an acid; $R^7$ is a methylene group, an oxygen atom, a sulfur atom or $—SO_2—$; $R^8$, $R^9$, $R^{10}$ and $R^{11}$ are the same or different and are a hydrogen atom, a fluorine atom, a hydroxyl group, $—OR^{13}$, $—CO_2R^{13}$, $—R^{12}—OR^{13}$ or $—R^{12}—CO_2R^{13}$, at least one of $R^8$, $R^9$, $R^{10}$ and $R^{11}$ including $—OR^{13}$, $—CO_2R^{13}$, $—R^{12}—OR^{13}$ or $—R^{12}—CO_2R^{13}$ (wherein $R^{12}$ is a straight-chain alkylene group, a branched or cyclic alkylene group or a fluoridated alkylene group with a carbon number not less than 1 and not more than 20 and $R^{13}$ is a hydrogen atom, a straight-chain alkyl group, a branched or cyclic alkyl group or a fluoridated alkyl group with a carbon number not less than 1 and not more than 20, or a protecting group released by an acid); $0<a<1$; $0<b<1$; and c is 0 or 1, and
wherein $R^3$ of said first unit is a trifluoromethyl group.

20. The pattern formation method of claim 19, wherein said resist material further includes an acid generator for generating an acid through irradiation with light.

21. The pattern formation method of claim 19, wherein said resist material further includes a dissolution inhibitor for inhibiting dissolution of said base polymer.

22. The pattern formation method of claim 19, wherein said second unit is represented by the following Chemical Formula 14:

Chemical Formula 14:

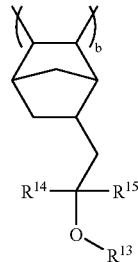

wherein $R^{13}$ is a hydrogen atom, a straight-chain alkyl group, a branched or cyclic alkyl group or a fluoridated alkyl group with a carbon number not less than 1 and not more than 20, or a protecting group released by an acid; $R^{14}$ and $R^{15}$ are trifluoromethyl groups; and $0<b<1$.

23. The pattern formation method of claim 19, wherein said polymer compound further includes a third unit represented by a general formula of the following Chemical Formula 15:

Chemical Formula 15:

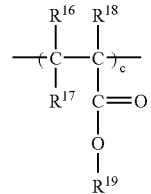

wherein $R^{16}$, $R^{17}$ and $R^{18}$ are the same or different and are a hydrogen atom, a fluorine atom, or a straight-chain alkyl group, a branched or cyclic alkyl group or a fluoridated alkyl group with a carbon number not less than 1 and not more than 20; $R^{19}$ is a hydrogen atom, a straight-chain alkyl group, a branched or cyclic alkyl group or a fluoridated alkyl group with a carbon number not less than 1 and not more than 20, or a protecting group released by an acid; and $0<c<1$.

24. The pattern formation method of claim 19, wherein said protecting group released by an acid is an acetal group.

25. The pattern formation method of claim 19, wherein said exposing light is KrF laser, ArF laser, $F_2$ laser, $Kr_2$ laser, KrAr laser, $Ar_2$ laser or soft X-rays.

* * * * *